(12) United States Patent
Wang et al.

(10) Patent No.: US 6,180,993 B1
(45) Date of Patent: Jan. 30, 2001

(54) ION REPULSION STRUCTURE FOR FUSE WINDOW

(75) Inventors: Shiou-Yu Wang, Taipei; Tean-Sen Jen, Chiai, both of (TW)

(73) Assignee: Nanya Technology Corp. (TW)

( * ) Notice: Under 35 U.S.C. 154(b), the term of this patent shall be extended for 0 days.

(21) Appl. No.: 09/153,870

(22) Filed: Sep. 15, 1998

(30) Foreign Application Priority Data

Jun. 17, 1998 (TW) .................................. 87109726

(51) Int. Cl.⁷ .................... H01L 29/00; H01L 23/58; H01L 23/62; H01L 29/74; H01L 31/111
(52) U.S. Cl. .................... 257/529; 257/173; 257/665; 257/355
(58) Field of Search .................... 257/529, 173, 257/665

(56) References Cited

U.S. PATENT DOCUMENTS

| | | | |
|---|---|---|---|
| 5,652,459 | * 7/1997 | Chen | 257/529 |
| 5,757,060 | * 5/1998 | Lee et al. | 257/529 |
| 5,990,537 | * 11/1999 | Endo et al. | 257/529 |

* cited by examiner

Primary Examiner—Mahshid Saadat
Assistant Examiner—Jesse A. Fenty
(74) Attorney, Agent, or Firm—Michael D. Bednarek; Shaw Pittman

(57) ABSTRACT

An ion repulsion structure for a fuse window is provided. The ion repulsion structure includes multi-level metallic layers and a P-type silicon semiconductor substrate having a plurality of wells. The P-type silicon semiconductor substrate includes an N-type well, a P-type well formed in the N-type well and a plurality of P+ type diffusion regions formed in the P-type well. A fuse element is formed on the P-type silicon semiconductor substrate. A fuse window layer is formed over the fuse element. Multi-level metallic layers surrounding the fuse window are formed. A plurality of contact plugs is electrically connected between the P+ type diffusion regions of the semiconductor substrate and the lowest metallic layer. A plurality of via plugs electrically connect the multi-level metallic layers to each other.

17 Claims, 3 Drawing Sheets

ION REPULSION STRUCTURE FOR FUSE WINDOW

BACKGROUND OF THE INVENTION

1. Field of the Invention

The present invention generally relates to semiconductor devices, and more particularly to an ion repulsion structure having a plurality of wells in a semiconductor substrate and multi-level metallic layers surrounding fuse windows.

2. Description of Related Art

In semiconductor devices, an electrical test is performed on each semiconductor chip after the wafer-state in which active or passive elements are formed on a semiconductor substrate, and before packaging of the chip. In this test, a probe is brought into contact with bonding is pad of the semiconductor chip so that its performance can be tested.

However, the current trend towards the integration of semiconductor devices allows the shortening of the distance between lines, tending to increase the number of defects tends arising in the manufacturing process, thereby reducing yields. Therefore, integrated circuits (ICs), for example semiconductor memories such as static random access memory (SRAM) or dynamic random access memory (DRAM), are each provided with a redundancy circuit for repairing defects present in some memory cells which arose in the memory manufacturing process. For example, defective cells may be replaced by the redundancy circuit by cutting fuses associated with the defective cells on the basis of the test results, and then activating a spare row or column of cells. Typical methods for cutting a fuse are using a laser beam to melt the fuse or passing a high current through the fuse.

As an example, a semiconductor device provided with a fuse according to the prior art method will be described briefly. A cross sectional view of a portion of a semiconductor device is illustrated schematically in FIG. 1.

As shown in FIG. 1, a substrate 100 having a main surface includes a fuse forming area 200, a bonding pad forming area 300, and a semiconductor element forming area 400.

First, the semiconductor substrate 100, which is, for example, a silicon, germanium or gallium-arsenide substrate, is provided. Moreover, the substrate can be an epitaxial layer or silicon on insulator (SOI) layer. For simplicity, a P-type silicon substrate is utilized in the embodiment.

Over the semiconductor substrate 100, semiconductor elements are formed by a conventional method. For example, a thermal oxidation step, such as the LOCOS method, is carried out to form a field oxide layer 120 over the substrate 100, thereby defining an active region of the transistor and capacitor. Then steps such as deposition, micro-lithography, and ion implantation are carried out to form the elements in the active region of the semiconductor element forming area 400. The elements include upper and lower electrode plates, a polysilicon gate structure, an N-type source diffusion region and an N-type drain diffusion region. The gate structure can be a word line (not shown).

Next, an insulating layer or an inter-level dielectric layer 140(ILD) is formed over the field oxide 120 and the substrate 100 and then planarized by means of thermal reflow process. The insulating layer 140 may be made of silicon dioxide deposited by means of chemical vapor deposition. More specifically, the insulating layer 140 can be a silicon dioxide layer deposited by means of a low-pressure chemical vapor deposition (LPCVD) process by reacting tetra-ethyl-ortho-silicate (TEOS). Alternatively, the insulating layer 140 can be a borophosphosilicate glass layer (BPSG) deposited by means of an atmospheric-pressure chemical vapor deposition (APCVD) process by the reaction of TEOS and $O_3/O_2$, with the addition of tri-ethyl-borate (TEB) and tri-methyl-phosphate (TMP). Preferably, the insulating layer 140 has a thickness of about 3000~10000 Å.

Furthermore, as the demand for higher integration increases, a multi-level interconnected structure becomes applicable to these ICs. The multi-level interconnected structure can provide the IC not only with a higher integration but also a freedom of design. For example, semiconductor elements, such as field effect transistors, capacitors, metal lines, etc., can be formed in the semiconductor elements forming area 400.

Still referring to FIG. 1, a lower metallic layer 420 composed of a single aluminum or aluminum alloy and an inter-metal dielectric (IMD) 160 made of low-permittivity insulating materials are sequentially deposited on the insulating layer 140. Aluminum wiring and low-permittivity insulating materials provide a large margin for improving RC delay. In addition, a lower dielectric constant also reduces the line capacitance and thus cuts down the cross talk between conductors. Next, a via hole is formed in the IMD 160 by means of a conventional photo-etch process. Then, a metal layer made of tungsten material is deposited in the via hole as well as on the IMD 160. Etching back the metal layer 300 leaves a via plug 440 in the via hole. After that, an upper metallic layer 460 composed of a single aluminum or aluminum alloy is formed. Electrical connections are made between the upper metallic layer 460 and the lower metallic layer 420 through the use of via plug 440.

A fuse is generally formed over field oxide layers and covered by more than two insulating layers in the fuse forming area 200. The fuse 210 is preferably composed of metal materials such as aluminum, a silicide such as tungsten silicide, polysilicon, or a polycide such as titanium polycide. For example, a polysilicon fuse 210 is formed simultaneously with other polysilicon conducting paths. It is arranged on the same layer together with other electronic components such as transistors, capacitors, bit lines and the like. Furthermore, it is sandwiched by the field oxide layer 120 and insulating layers such as the borophosphosilicate glass layer (BPSG), the inter-metal dielectric layer (IMD) 160 and so on, to prevent the shorting of the fuse to the substrate during a laser beam cutting process.

Next, in the bonding pad forming area 300, by means of a conventional photo-etching process, a bonding pad 320 may be formed simultaneously with the upper metallic layer 460.

Then, a silicon oxide layer 180, which constitutes a part of a final passivation layer, is formed over the insulating layer (IMD) 160, bonding pad 320, upper metallic layer 460 and the like, by a chemical vapor deposition (CVD) method to avoid damage due to any temperature rise.

Next, as shown in FIG. 2, by a conventional photo-etching process, an aperture (fuse window) 280 is formed above the fuse 210 and a hole 340 is formed to expose portions of the bonding pad 320. Then, a probe (not shown) is brought into contact with the surface of the bonding pad 320 through this hole 340 and an electrical test is conducted. When a defective memory cell is discovered as a result of this test, a laser beam is radiated to the fuse 210 through the insulating layers 140 and 160 located below the fuse window 280 in order to melt the fuse 210 and form a laser repair hole 210'. In this manner, the defective cells are replaced by the redundancy circuit and the corresponding spare row or column of cells is activated.

However, it is also very possible that moisture and contamination from the air might enter the exposed insulating 140 and 160 through the fuse window 280. Furthermore, after cutting the fuse 210 by the laser beam, mobile ions such as aluminum ions, sodium ions and potassium ions ($Al^{+3}$, $Na^+$, $K^+$) are able to penetrate into the exposed portions of the insulating layers and diffuse to nearby semiconductor devices through the laser repair hole 210'. This means that the contaminants could cause the occurrence of corrosion, the failure of the highly accelerated stress test (HAST) described below in table 1, and the reduction of reliability and yields.

TABLE 1

| | |
|---|---|
| Test name | Highly Accelerated Stress Test |
| Acronym | HAST |
| Test purpose | To evaluate the reliability of packaged devices in humid environments. It employs unusual conditions of temperature, humidity, and bias which accelerate the penetration of electrolytic moisture through the external protective material. |
| Test conditions | 130° C.; 85% RH; Vcc = individual spec. value |
| Example | Aluminum corrosion |

SUMMARY OF THE INVENTION

It is therefore an object of the present invention to provide an ion-repulsion structure for a fuse window that can prevent electrolytic moisture or mobile ions from penetrating into semiconductor devices.

The present invention achieves the above-indicated object by providing an ion-repulsion structure that has a plurality of wells in a semiconductor substrate and multi-level metallic layers surrounding the fuse window.

In a preferred embodiment, the ion-repulsion structure includes multi-level metallic layers and a semiconductor substrate of a first conductivity type having a plurality of wells. The semiconductor substrate of the first conductivity type has a first well of a second conductivity type, a second well of the first conductivity type formed in the first well, and a plurality of diffusion regions of the second conductivity type formed in the second well. A fuse element is formed on the semiconductor substrate. A fuse window layer is formed over the fuse element. Multi-level metallic layers surround the fuse window layer. A plurality of contact plugs are electrically connected between the diffusion regions of the semiconductor substrate and the lowest multi-level metallic layer. A plurality of via plugs electrically connect the multi-level metallic layers to each other. In addition, the first well of the second conductivity type and the second well of the first conductivity type well may be electrically connected to a reverse bias voltage.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE INVENTION

Figure 1:
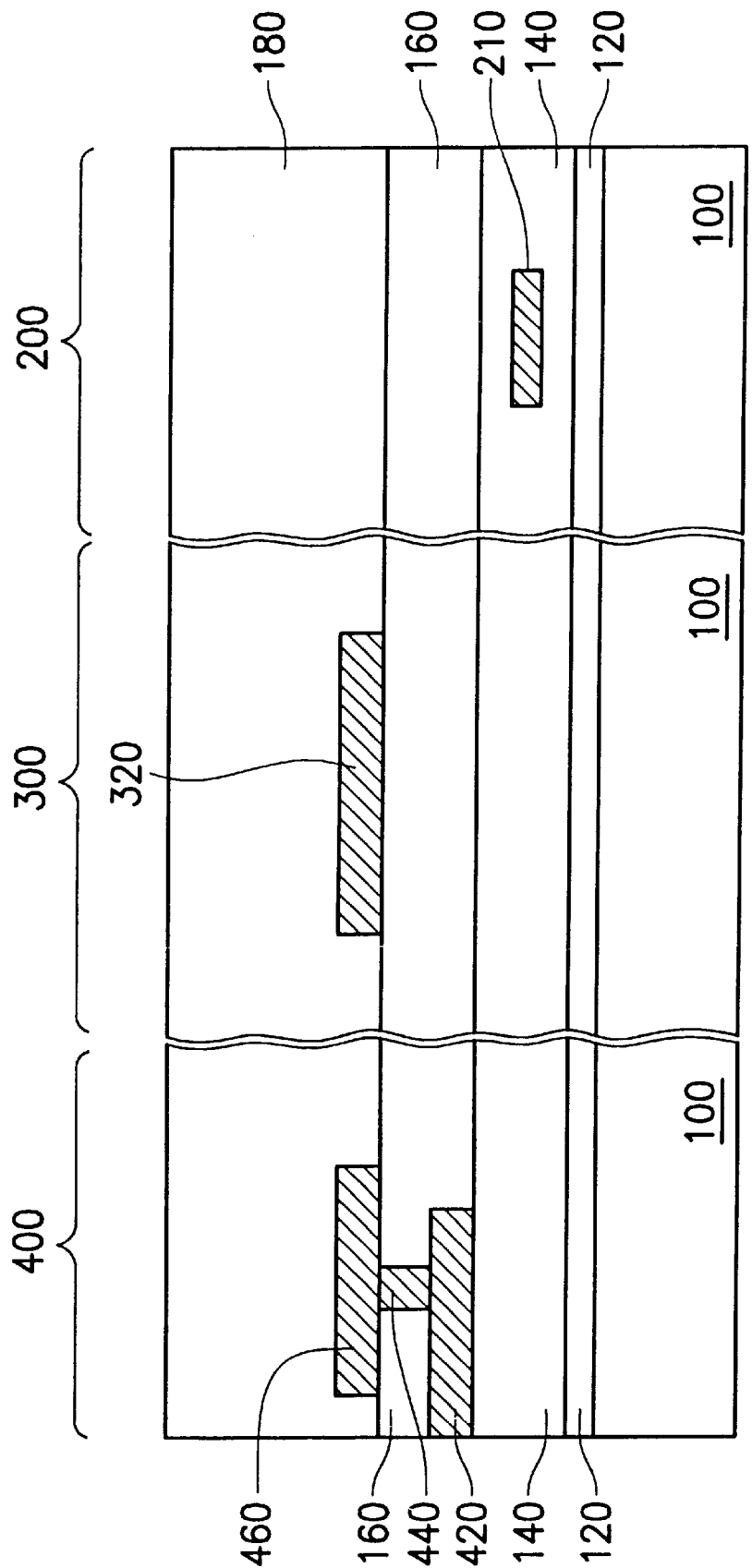
FIGS. 1 and 2 are cross-sectional views of principal portions of a semiconductor substrate, showing a manufacturing process of how to fabricate a conventional semiconductor device.
Figure 2:
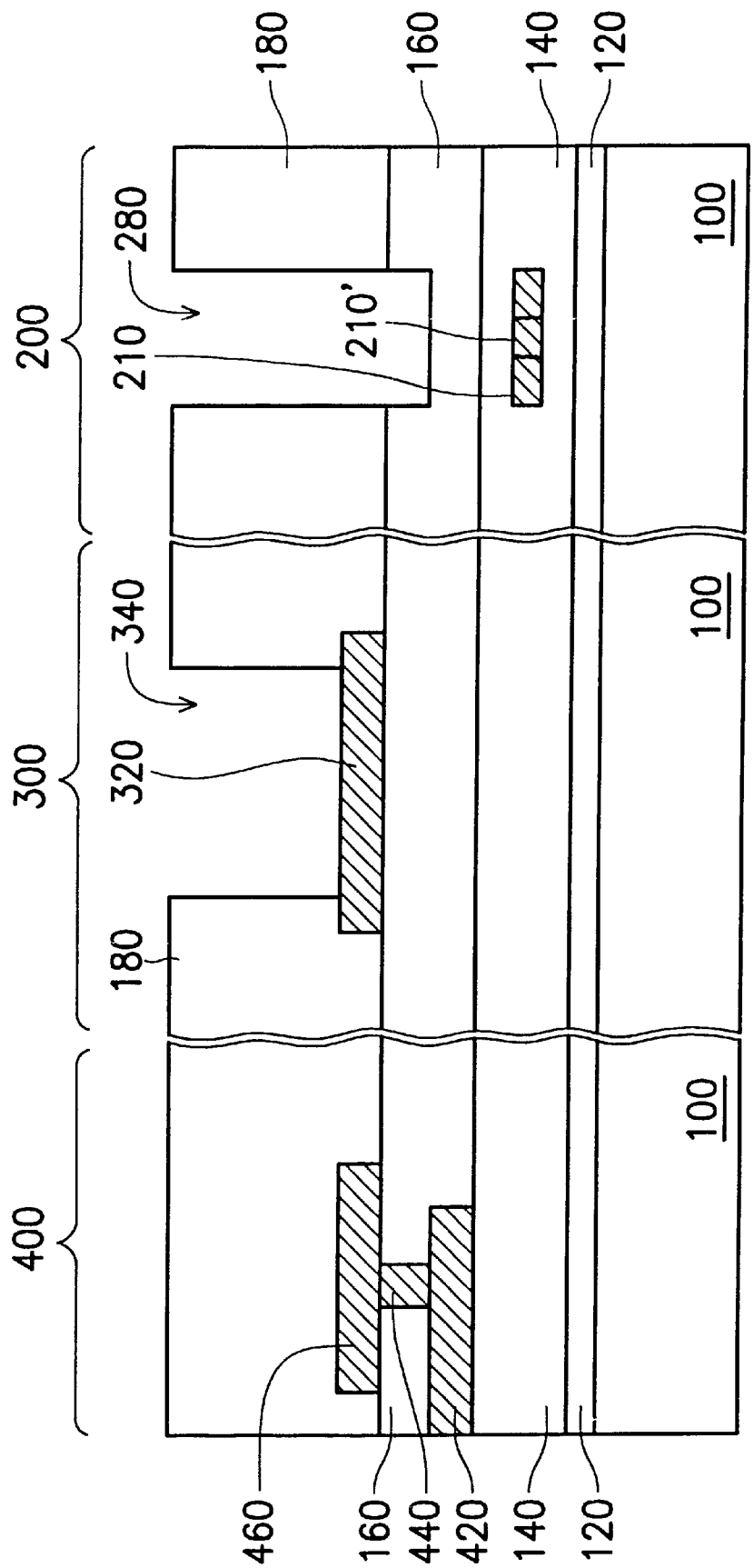
Figure 3:
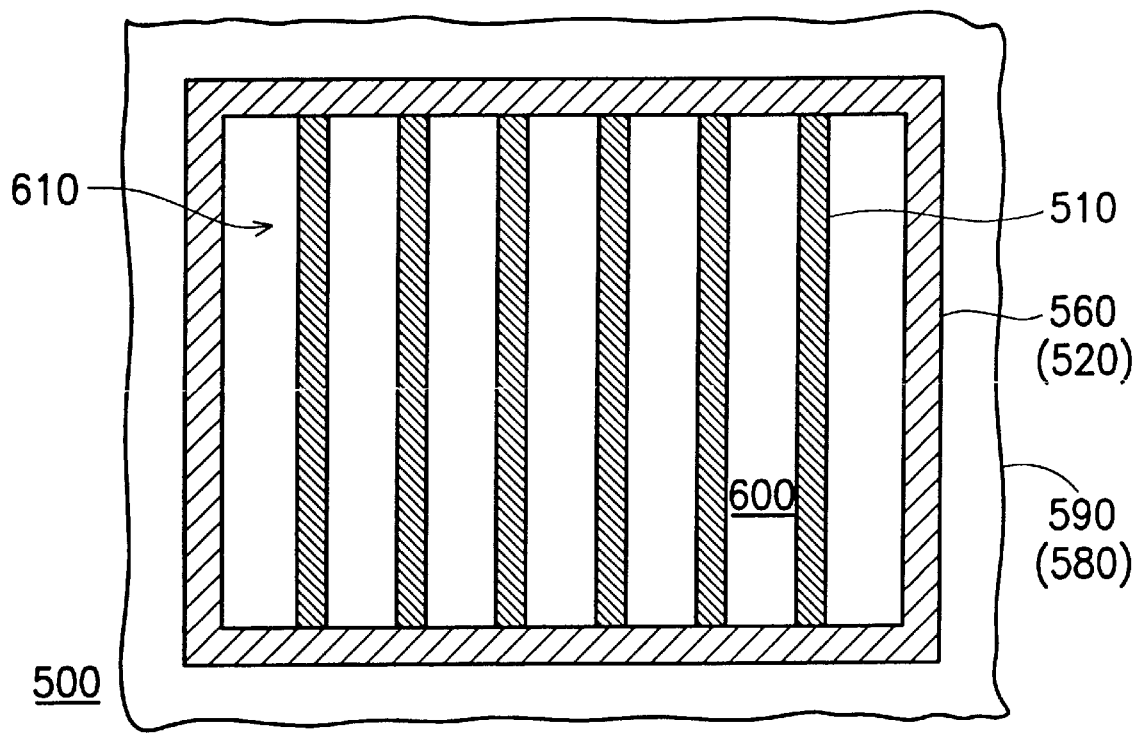
FIG. 3 is a top-view of principal portions of a semiconductor substrate, showing an ion-repulsion structure surrounding a fuse window in accordance with the present invention.
Figure 4:
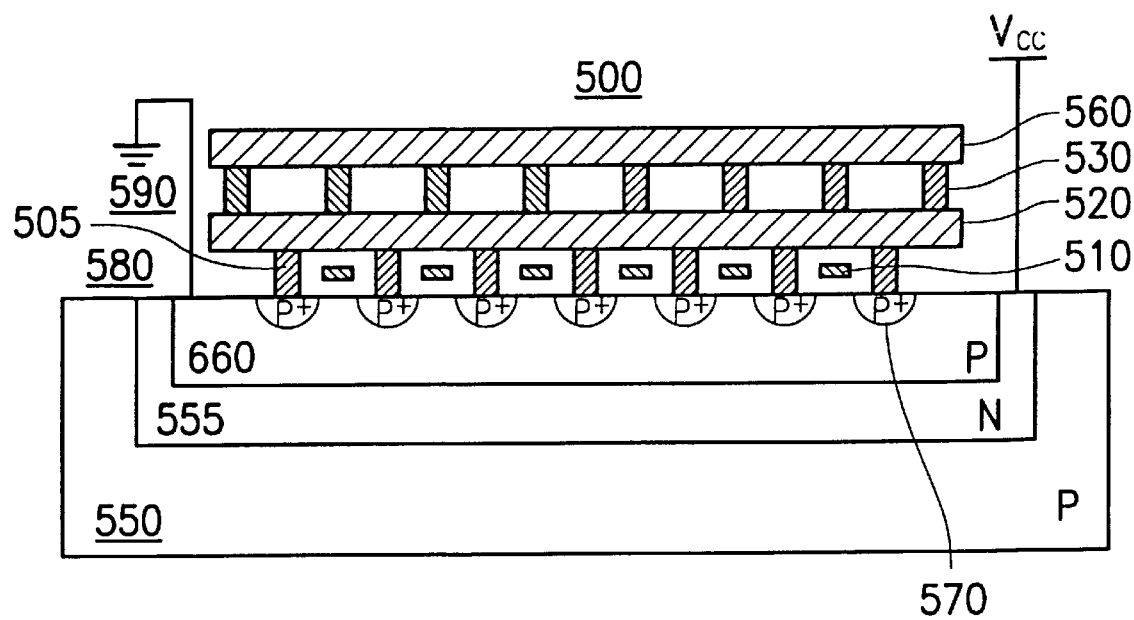
FIG. 4 is a cross-sectional view of FIG. 3.

Referring to FIG. 3, the preferred embodiment in accordance with the present invention is schematically depicted in a top-view. FIG. 4 is a cross-sectional view of FIG. 3. A fuse forming area 500 is formed over a main surface of a semiconductor substrate 550, in which a number of semiconductor devices (not shown in the drawing) have been fabricated. For example, the semiconductor substrate 550 is understood to possibly include a wafer, active or passive elements formed within the wafer, and insulating or conducting layers formed on the wafer surface.

In accordance with the preferred embodiment, an ion repulsion structure includes a semiconductor substrate 550; a fuse element 510 formed on the semiconductor substrate 550; a fuse window layer 600 formed over the fuse element 510; at least one metallic layer 560(520) surrounding the fuse window layer 600; and a plurality of plugs (505,530) electrically connected between portions of the semiconductor substrate (570) and the metallic layer 560(520).

For example, the substrate 550 made of semiconductor material such as silicon might be provided by means of epitaxial processes or silicon-on-insulator (SOI) processes. For convenience, a P-type silicon substrate is exemplified.

Next, multi-level wells, for example triple-level wells, are formed in the P-type silicon semiconductor substrate 550. The triple-level wells include an N-type well 555, a P-type well 660 formed in the N-type well 555, and a plurality of P+ type diffusion regions 570 formed in the P-type well 660. The wells can be doped with diffusion or ion implantation methods. Preferably, the N-type doping impurities are either arsenic-containing ions or phosphorus-containing ions, and the P-type doping impurities are boron-containing ions.

Then, a fuse element 510 is formed on the P-type silicon semiconductor substrate 550. The fuse element 510 is preferably composed of metal materials such as aluminum, a silicide such as tungsten silicide, polysilicon, or a polycide such as titanium polycide. For example, polysilicon fuses 510 are formed by reacting $SiH_4$ through a low-pressure chemical vapor deposition process, which are formed simultaneously with other polysilicon conducting paths. They can be arranged on the same layer together with other electronic components such as transistors, capacitors, bit lines and the like (not shown). Then the fuse element 510 is sandwiched by the insulating layers 580 such as the borophosphosilicate glass layer (BPSG), the inter-metal dielectric layer (IMD) and so on. That is, the insulating layers 580 can insulate each of the other conducting layers and prevent the shorting of the fuse element 510 to the substrate 550 during a laser beam cutting process.

Next, at least one metallic layer is formed on the insulating layers 580. For example, a plurality of conducting layers 520 and 560 made of metal materials, such as tungsten (W), aluminum (Al) or aluminum alloy (AlSiCu and AlCu), are formed on the insulating layer 580 by sputtering, for example magnetron DC sputtering. Then the metallic layers are selectively etched in accordance with a desired pattern to form the window-shaped multi-level metallic layers 520 and 560 which are located around the fuse element 510. Insulating layers 590 such as the borophosphosilicate glass layers (BPSG), the inter-metal dielectric layers (IMD) and so on, are formed to insulate each of the window-shaped multi-level metallic layers 520 and 560.

In the insulating layers 580 and 590, there are formed holes, and plugs made of conducting materials are formed in the holes. For example, contact plugs 505 are used to electrically connect the P+ type diffusion regions 570 of the semiconductor substrate 550 and the lowest metallic layer, for example 520, while via plugs 530 are used to electrically connect the upper and lower metallic layers, for example 520 and 560.

Furthermore, a fuse window layer 600, as depicted in FIG. 3, is formed over the fuse element 510. For example, the fuse window layer 600 comprises insulating layers 580 and 590, which have been patterned and anisotropically etched as shown to form an opening 610 located above the fuse element 510, which has in turn been surrounded by the multi-level metallic layers 520 and 560. Preferably, the etching process is implemented by means of the reactive ion etch process to etch the insulating layers 580 and 590 in order to form the fuse window layer 600.

Next, the N-type well 555 and P-type well 660 are electrically connected to a reverse bias voltage. For example, the N-type well 550 is electrically connected to a positive voltage source such as a system voltage Vcc, and the P-type well 660 is electrically connected to a circuit ground or negative bias voltage. Furthermore, the multi-level metallic layers are electrically connected to circuit ground or negative bias voltage.

Therefore, in humid environments or in a highly accelerated stress test (HAST), moisture and contamination entering the fuse window 610, especially mobile ions such as aluminum ions, sodium ions and potassium ions ($Al^{+3}$, $Na^+$, $K^+$), can be absorbed by the multi-level metallic layers 520 and 560. Furthermore, electrical connections are made among the multi-level metallic layers (520, 560) and between the diffusion regions of the semiconductor substrate (570) and the lowest metallic layers (520) through the plugs (505). Hence, some of the mobile ions can still enter the plurality of wells of the substrate through the described conducting path. Base on the above embodiments, the mobile ions would move to the circuit ground in the P-well 660 and the remaining mobile ions as the minority carrier would be recombined with electrons in the N-type well 555. That is, by means of the reverse bias voltage of the plurality of wells, mobile ions can not penetrate into the exposed portions of the insulation layers and diffuse to nearby semiconductor devices through the fuse window. This means that the contaminants would not cause the occurrence of corrosion and the failure of the table 1 of the highly accelerated stress test (HAST).

In conclusion, the ion repulsion structure for fuse windows will improve reliability by means of a plurality of wells in a semiconductor substrate and multi-level metallic layers surrounding fuse windows to reduce metal corrosion and contamination, especially mobile ions.

The foregoing description of preferred embodiments of the present invention has been provided for the purposes of illustration and description. It is not intended to be exhaustive or to limit the invention to the precise forms disclosed. For example, it will be readily appreciated that a complementary conductivity type embodiment may be used. Many modifications and variations will be apparent to practitioners skilled in the art. The embodiments were chosen and described to best explain the principles of the invention and its practical application, thereby enabling others skilled in the art to understand the invention and to practice various other embodiments and make various modifications suited to the particular use contemplated. It is intended that the scope of the invention be defined by the following claims or their equivalents.

What is claimed is:

1. An ion repulsion structure compromising:
    a semiconductor substrate including a first well, a second well formed in said first well and a plurality of diffusion regions formed in said second well;
    a fuse element formed on said semiconductor substrate;
    a fuse window layer formed over said fuse element;
    a metallic layer surrounding said fuse window layer; and
    a plurality of plugs electrically connected between said diffusion regions and said metallic layer.

2. The ion repulsion structure of claim 1, wherein said semiconductor substrate is a P-type silicon substrate.

3. The ion repulsion structure of claim 2, wherein said first well is an N-type well, said second well is a P-type well and said diffusion regions are P+ type diffusion regions.

4. The ion repulsion structure of claim 3, wherein the plurality of plugs are electrically connected between said P+ type diffusion regions of said semiconductor substrate and said metallic layer.

5. The ion repulsion structure of claim 4, wherein said N-type well and P-type well are electrically connected to a reverse bias voltage.

6. The ion repulsion structure of claim 5, wherein said N-type well is electrically connected to a positive voltage source.

7. The ion repulsion structure of claim 5, wherein said P-type well is electrically connected to a ground.

8. The ion repulsion structure of claim 5, wherein said metallic layer is electrically connected to a negative bias voltage source.

9. The ion repulsion structure of claim 5, wherein said metallic layer is electrically connected to a ground.

10. The ion repulsion structure of claim 5, wherein said P-type well is electrically connected to a negative bias voltage source.

11. An ion repulsion structure comprising:
    a semiconductor substrate having a first well, a second well formed in said first well and a plurality of diffusion regions formed in said second well, wherein a conductivity type of said first well being complementary to a conductivity type of said semiconductor substrate and said second well;
    a fuse element formed on said semiconductor substrate;
    an insulating fuse window layer formed over said fuse element;
    a metallic layer surrounding said insulating fuse window layer; and
    a plurality of plugs electrically connected between said diffusion regions and said metallic layer.

12. The ion repulsion structure of claim 11, wherein said diffusion regions are highly doped regions whose doped concentration is higher than those of said second well.

13. The ion repulsion structure of claim 11, wherein said fuse element is made of polysilicon materials.

14. The ion repulsion structure of claim 11, wherein said fuse element is made of metal materials.

15. The ion repulsion structure of claim 11, wherein said plugs are made of polysilicon materials.

16. An ion repulsion structure comprising:
    a P-type silicon semiconductor substrate including an N-type well, a P-type well formed in said N-type well and a plurality of P+ type diffusion regions formed in said P-type well;
    a fuse element formed on said P-type silicon semiconductor substrate;
    an insulating fuse window layer formed over said fuse element;
    a plurality of metallic layers surrounding said insulating fuse window layer, one of said metallic layers being the lowest;
    a plurality of contact plugs electrically connected between the P+ type diffusion regions of said semiconductor substrate and the lowest metallic layer; and
    a plurality of via plugs electrically connected said metallic layers to each other.

17. The ion repulsion structure of claim 16, wherein said via plugs are made of tungsten materials.

* * * * *